United States Patent [19]

Zitz et al.

[11] Patent Number: 4,506,932
[45] Date of Patent: Mar. 26, 1985

[54] DEVICE FOR COOLING THE BITS OF A CUTTING MACHINE

[75] Inventors: Alfred Zitz; Otto Schetina; Herwig Wrulich, all of Zeltweg, Austria

[73] Assignee: Voest-Alpine Aktiengesellschaft, Vienna, Austria

[21] Appl. No.: 382,651

[22] Filed: May 27, 1982

[30] Foreign Application Priority Data

Jun. 4, 1981 [AT] Austria .................. 2518/81

[51] Int. Cl.³ .............................................. E21C 7/08
[52] U.S. Cl. .......................................... 299/1; 299/81
[58] Field of Search ............... 299/81, 17, 1; 175/317; 251/320, 323, 118, 321

[56] References Cited

U.S. PATENT DOCUMENTS

| | | | |
|---|---|---|---|
| 1,022,851 | 4/1912 | Knack | 251/32 D X |
| 1,365,369 | 1/1921 | Boyce | 251/32 D |
| 2,001,487 | 5/1935 | Doherty | 251/323 X |
| 3,025,871 | 3/1962 | Roth et al. | 251/118 X |
| 3,536,095 | 10/1970 | Demeter et al. | 251/321 X |
| 3,853,300 | 12/1974 | Brynste et al. | 251/321 X |
| 4,333,687 | 6/1982 | Barnstorf | 299/17 X |

FOREIGN PATENT DOCUMENTS

| | | | |
|---|---|---|---|
| 0010534 | 4/1980 | European Pat. Off. | 299/1 |
| 0040334 | 11/1981 | European Pat. Off. | 299/81 |
| 621873 | 8/1978 | U.S.S.R. | 299/81 |
| 685821 | 9/1979 | U.S.S.R. | 299/81 |

Primary Examiner—Stephen J. Novosad
Assistant Examiner—Beverly E. Hjorth
Attorney, Agent, or Firm—Cushman, Darby & Cushman

[57] ABSTRACT

Figure 1:
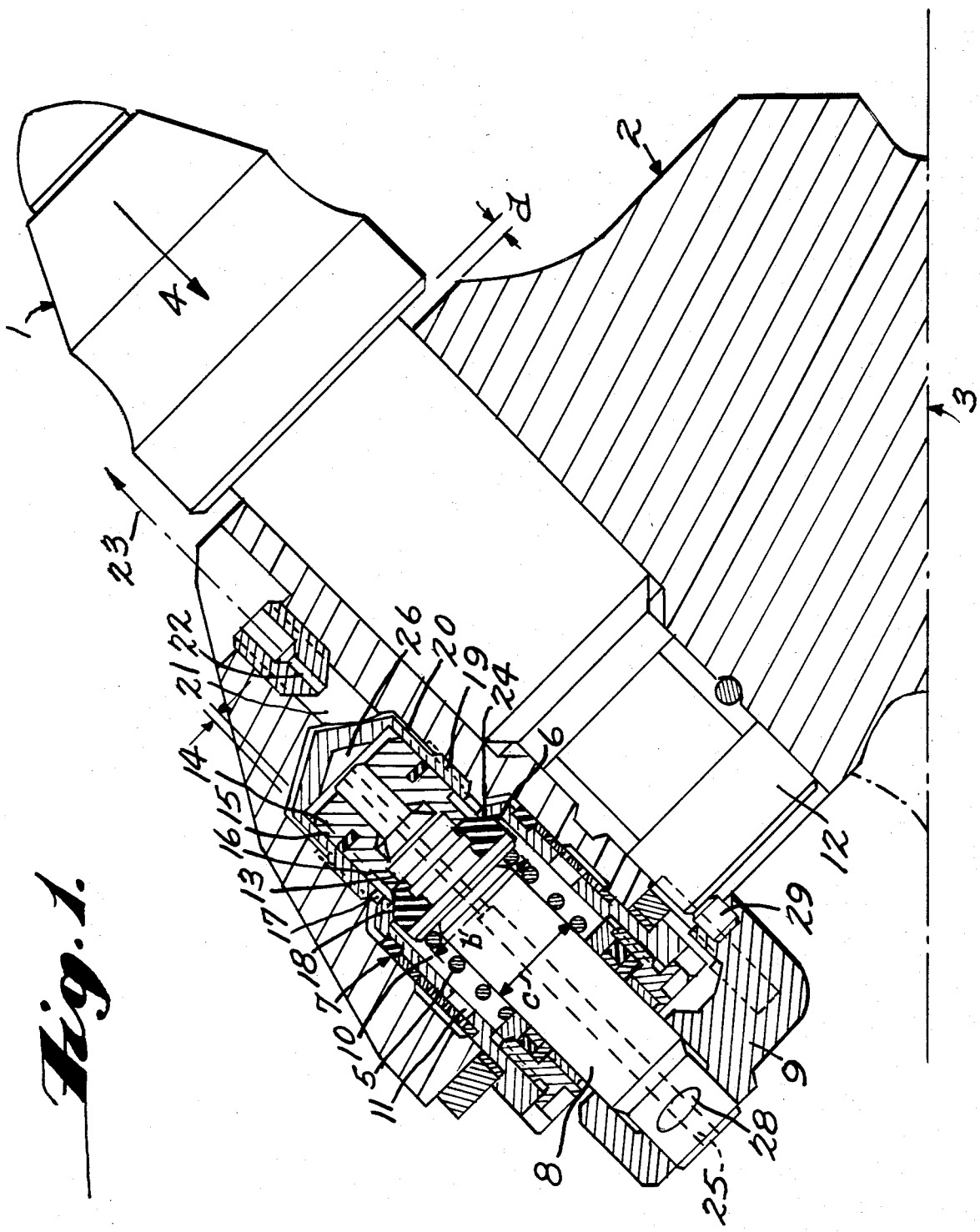

The bits (1) of a cutting machine are subjected with water under pressure by means of nozzles (22), water supply to the nozzles (22) being given free by a valve cone (6) as soon as the bit (1) within the bit holder (2) is shifted in axial direction against the force of a spring. Axial movement of the bit (1) is effected by the cutting pressure and the shifting path of the bit (1) is transmitted to the valve cone (6) via a coupling member (9). The force of the spring (5) is rated such that the spring presses the bit (1) against its own weight and against the internal frictional resistances into its starting position in non-loaded condition with simultaneous closing of the valve cone (6). The restoring forces are, with connected conduits for pressurized water, substantially greater than the spring force, the active surface of the valve cone (6) acted upon by the water pressure in closing sense determining the force above which opening of the valve becomes possible. The valve is only opened above a minimum hardness of the rock and thus above a predetermined lower limit for the cutting pressure (FIG. 1).

2 Claims, 2 Drawing Figures

DEVICE FOR COOLING THE BITS OF A CUTTING MACHINE

The invention refers to a device for cooling the bits of a cutting machine comprising a nozzle, arranged within the area of the bit, for the cooling water to be ejected under pressure and the water supply to said nozzle can be closed by a valve cone, the bit being supported on the bit holder for limited axial shifting movement under the action of the cutting pressure and against the restoring force providing by a spring and by the water pressure acting on the valve cone and the valve cone being coupled with the bit by a coupling member such that the valve cone opens on occasion of a shifting movement of the bit in direction of the cutting pressure. The bits are, e.g., arranged on a cutting head or on a cutting roll. The device defined above is either provided for each bit or only for those bits which are subjected to higher stress. In known devices of the kind defined, the restoring force is substantially provided by the force of the spring. The shut-off valve is arranged such that the water pressure acting on the valve acts also in the sense of closing the valve, the water pressure does, however, provide only a small fraction of the restoring force. In case of a fracture of the spring, the shut-off valve is thus no more operable. Furthermore, a strong spring has necessarily relatively great dimensions and this is disadvantageous because the nozzle and thus also the valve must be arranged within the bit holder.

It is an object of the invention to reduce the dimensions of the spring and to maintain the valve operable also in case of a fracture of the spring.

The invention essentially consists in that with an arrangement in which the valve cone is opening only at a predetermined load of the bit, the water pressure upstream of the valve cone multiplied by that active surface of the valve cone being subjected by the water pressure in the sense of closing the valve essentially corresponds to the restoring force and in that the spring is given only such a strength that the spring moves the valve cone, with the water supply shut off, against the weight of the valve cone and of the bit and against the internal frictional resistances. For reliably preventing water ejection from the nozzle if the bit does not contact the rock, the closure valve shall open only at a predetermined load of the bit. If it is now intended to open the valve only if a predetermined cutting pressure is acting on the bit and thus to avoid water consumption when cutting soft rock in which case cooling of the bit and of the cutting face is not necessary, a relatively high restoring force acting on the bit is required and this restoring force is now, according to the invention, provided by the water pressure. If, however, only the water pressure would act on the shut-off valve in the sense of closing same, the position of the valve would not be a defined position in non-operative position of the cutting tool, e.g., at the beginning of operation or after a repair. The shut-off valves associated with the bits just located at a higher level would solely by the weight of the bits be brought into open position and also the other valves could not reliably be brought into closed position on account of internal resistances and, respectively, the existing friction. If a great number of valves would be in open position, a very great supply capacity of the water pump would be required for closing the valves solely by the water pressure, but the capacity of water pumps being dimensioned for normal operation is not sufficient for closing all valves. Thus, one could not be sure that the valves are moved into the correct operating position. For this purpose, there are provided additional springs acting on the valves and reliably moving the valves in closed position under non-operative condition, but these springs can be designed so weak that they are only sufficient for closing the respective valve against the force of the valve cone and of the bit and against the internal resistances. These springs can thus be very weakly dimensioned. In case of a fracture of individual springs, the operability of the valves is still existing because the restoring force is essentially provided by the water pressure and because, in case one or the other of the valves is not maintained in closed position, the supply capacity of the pump is still sufficient for moving the valves in consideration into their closed positions.

According to a preferred embodiment of the invention the arrangement is such that the valve cone is, in manner known per se, opening in opposite direction to the flow direction of the water and has a valve shaft sealingly guided within the valve housing, that the valve cone is rigidly connected with a piston arranged downstream of the valve cone and sealingly guided within a cylinder of the valve housing, a space between valve cone and piston being connected via at least one exit opening for the water with the space upstram of the nozzle, and that the diameter of the piston is greater than the diameter of the shaft of the valve cone. With closed shut-off valves, the water pressure is now acting on an annular surface, the surface extent of which corresponds to the cross section of the valve seat reduced by the cross section of the valve shaft, and it is only on overcoming the water pressure acting on this annular surface that the valve opens. If the valves are in open position, the water pressure acts on an annular surface, the surface extent of which corresponds to the cross section of the piston reduced by the cross section of the valve shaft. The water pressure acting on this annular surface defines now the restoring force for the opened shut-off valve and in view of the diameter of the piston being greater than the diameter of the shaft the shut-off valve is maintained in open position. It is only if this restoring force overcomes the cutting pressure of the bit that the shut-off valve becomes closed. By suitably selecting the ratio of cross sections, the restoring force can be dimensioned such that the shut-off valve is maintained in open position only as long as it is required to cool the bit and the cutting face, any water loss being reliably prevented during the remaining time interval.

The invention is schematically illustrated in the drawing by an embodiment.

Figure 2:
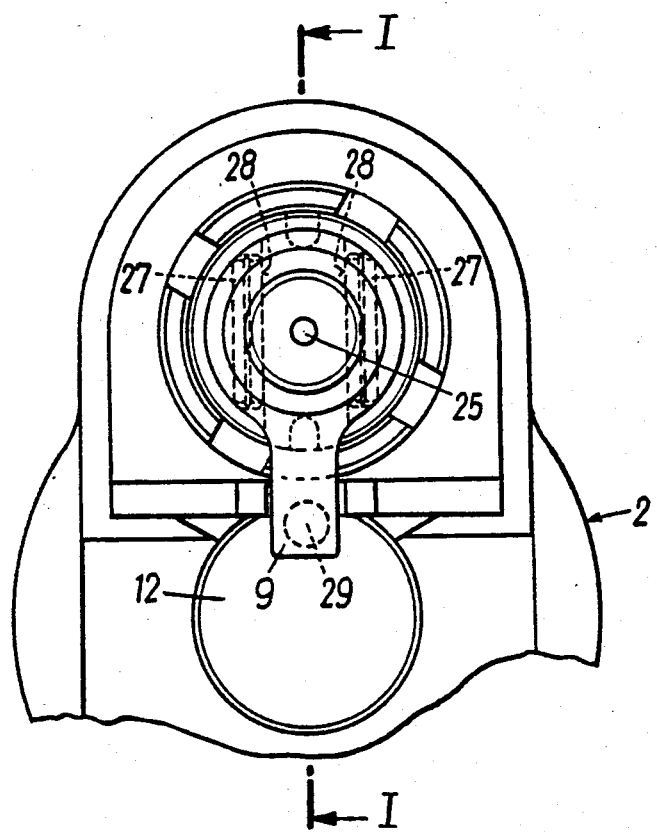

In the drawing, FIG. 1 shows a section through the bit holder and through the valve and along the axis of the bit and of the valve as taken along line I—I of FIG. 2, and FIG. 2 shows a view in direction of the arrow II of FIG. 1.

The bit 1 is supported within a bit holder 2 for being axially shiftable along a path a. 3 is that surface of the bit holder along which this bit holder is welded with the cutting head of a cutting machine. The bit 1 is loaded in opposite direction to the cutting pressure acting in direction of arrow 4 and is loaded by a finger 9 being connected with the shaft 8 of a valve cone 6 of a valve 7. The finger 9 acts on the bit shaft 12 via a pressure member 29. The pressure water is supplied to the space 10 located upstream of the valve cone 6 via openings 11 and via channels (not shown) provided within the cutting head and within the bit holder and thus acts on the valve cone 6 in direction of closing the valve. The valve cone 6 is furthermore loaded by a spring 5 equally acting in the sense of closing the valve. The force acting on the bit 1 via the finger 9 and in opposite direction to the cutting pressure is therefore composed of the force exerted by the water pressure and of the force of the spring 5.

A piston 14 is connected with the valve cone 6 by means of a thread 13 and is sealingly guided within a cylinder 15 by an indent located between the valve 6 and the piston 14, a space 16 is provided into which open exit openings 17 for the water. With the valve cone 6 lifted off its seat 18, the pressure water flows from the space 10 into the space 16 and from there via the exit opening 17 over grooves (not shown) provided within the thread 19 (this thread maintaining the cylinder 15 within the bit holder) and via a slot 20 between the cylinder and the bore of the bit holder to the space 21 located upstream of the nozzle 22. The water is ejected out of the nozzle 22 against the cutting face at the area of the bit 1 in a jet 23 of high energy. The water pressure within the space 21 is comparatively high and can reach, e.g., 200 bar.

If the valve is closed, i.e., the valve cone 6 rests on its valve seat 18, the water pressure prevailing within the space 10 acts on an annular surface, the surface extent of which corresponds to the cross section b of the outer edge 24 of the valve seat 18 reduced by the cross section c of the valve shaft 8. The valve is moved into open position as soon as the force exerted by the water pressure on the valve cone and the additional force of the spring 5 is overcome by the cutting pressure acting in direction of arrow 4.

If the valve is in open position, the water pressure generated within the space 16 corresponds to the pressure prevailing within the space 10 but reduced by the pressure losses in the flowing water. This water pressure acts, with the valve being in opening position, on an annular surface d, the surface extent of which corresponds to the cross section e of the piston 14 reduced by the cross section c of the valve shaft 8. In view of the cross section c of the valve shaft 8 being smaller than the cross section e of the piston 14, this force acts in the sense of closing the valve. If the valve cone 6 is lifted off its seat 18, the restoring force acting in the sense of closing the valve and in opposite direction to the cutting pressure (arrow 4) is composed of the force of the spring 5 and of the water pressure acting on the annular surface d.

25 is an opening within the valve shaft which opens into atmosphere and which depressurizes the space 26 located above the piston 14. 27 are wedges engaging grooves 28 of the valve shaft 8 and connecting the valve shaft 8 with the finger 9.

The cross sections b, c and d, onto which the water pressure acts within the valve 7, are dimensioned such that the water pressure essentially provides the restoring force counteracting the cutting pressure of the bit 1 acting in direction of arrow 4. The strength of the spring 5 is only rated for closing or, respectively, maintaining in closed position the valve cone 6 against the weight of this valve cone and of the bit and against the action of internal frictional forces. For this purpose it is, e.g., sufficient to pretension this spring to exert a force of 120N.

What is claimed is:

1. A device for cooling a bit of a cutting machine with a flow of water comprising a nozzle, arranged adjacent the bit, for cooling water to be ejected under pressure, a valve assembly which includes a valve housing and a valve cone movable into contact with a valve seat to close the valve assembly in the flow direction of the water, said valve cone having a valve shaft sealingly guided in said valve housing and the water supply to said nozzle can be closed by said valve cone, the bit being supported on a bit holder for limited axial shifting movement under the action of the cutting pressure and against a restoring force which is provided by a spring and by the water pressure acting on the valve cone and the valve cone being coupled with the bit by a coupling member such that the valve cone opens upon a shifting movement of the bit in the direction of the cutting pressure, characterized in that with an arrangement in which the valve cone opens only at a predetermined load on the bit, the water pressure upstream of the valve cone multiplied by an active surface of the valve cone which is subjected by the water pressure to a force tending to close the valve essentially corresponds to the restoring force and in that the spring has only such a strength that the spring moves the valve cone, with the water supply shut off, against the weight of the valve cone and the weight of the bit and against the internal frictional resistances, the valve cone being rigidly connected with a piston which is arranged downstream of the valve cone and sealingly guided within a cylinder in the valve housing, there being a space between valve cone and piston which space is connected via at least one exit opening for the water with a space upstream of the nozzle, the piston having a diameter greater than the diameter of the shaft of the valve cone.

2. A device as in claim 1 wherein said valve cone has a base portion connected to said valve shaft, said valve shaft residing in chamber to which the water is supplied and said valve shaft having a cross-sectional area less than the cross-sectional area of said valve cone, said valve cone having a conical portion engageable with a complementary annular portion of said valve seat, and wherein said active surface of said valve cone is the cross-sectional area taken at the outer edge of the portion of said valve seat engaged by said valve cone minus the cross-sectional area of said valve shaft.

* * * * *